United States Patent [19]
Sekine et al.

[11] Patent Number: 5,622,888
[45] Date of Patent: Apr. 22, 1997

[54] METHOD OF MANUFACTURING A SEMICONDUCTOR DEVICE

[75] Inventors: Makoto Sekine; Satoshi Kamiyama, both of Tokyo, Japan

[73] Assignee: NEC Corporation, Tokyo, Japan

[21] Appl. No.: 550,355

[22] Filed: Oct. 30, 1995

[30] Foreign Application Priority Data

Nov. 9, 1994 [JP] Japan .................... 6-274826

[51] Int. Cl.$^6$ .................................................. H01L 21/70
[52] U.S. Cl. ..................... 438/398; 438/674; 438/399; 438/665
[58] Field of Search .................... 437/919, 60, 977, 437/978, 245, 200; 148/DIG. 138

[56] References Cited

U.S. PATENT DOCUMENTS

| | | | |
|---|---|---|---|
| 5,079,191 | 1/1992 | Shinriki et al. | 437/60 |
| 5,139,974 | 8/1992 | Sandhu et al. | 437/977 |
| 5,182,232 | 1/1993 | Chhabra et al. | 437/977 |
| 5,352,623 | 10/1994 | Kamiyama | 437/919 |
| 5,360,766 | 11/1994 | Ko et al. | 437/977 |
| 5,366,919 | 11/1994 | Tanaka et al. | 437/977 |
| 5,438,012 | 8/1995 | Kamiyama | 437/60 |
| 5,441,011 | 8/1995 | Taniguchi | 437/60 |
| 5,444,006 | 8/1995 | Han et al. | 437/60 |
| 5,470,775 | 11/1995 | Nariani | 437/60 |
| 5,474,949 | 12/1995 | Hirao et al. | 437/977 |

FOREIGN PATENT DOCUMENTS

| | | | |
|---|---|---|---|
| 3-108720 | 5/1991 | Japan | 437/977 |
| 6-89984 | 3/1994 | Japan | 437/977 |

OTHER PUBLICATIONS

"A High–C Capacitor (20.4 fF/$\mu m^2$) With Ultrathin CVD—$Ta_2O_5$ Films Deposited on Rugged Poly–Si for High Density DRAMs," by P.C. Fazan et al., 1992 IEEE, IEDM 92, pp. 263–266.

*Primary Examiner*—John Niebling
*Assistant Examiner*—S. Mulpuri
*Attorney, Agent, or Firm*—Popham, Haik, Schnobrich & Kaufman, Ltd.

[57] ABSTRACT

A semiconductor device has a capacitive element with excellent leak current characteristics which has a tungsten film with a roughened surface for increasing the surface of a lower electrode. A capacitive element for use in a VLSI memory circuit such as a DRAM or the like is fabricated by forming a thin, roughened tungsten film selectively on a surface of a lower electrode of polysilicon by chemical vapor-phase growth and forming a capacitive insulating film on the surface of the lower electrode of polysilicon, densifying the capacitive insulating film, and forming an upper electrode of a metal element.

10 Claims, 8 Drawing Sheets

METHOD OF MANUFACTURING A SEMICONDUCTOR DEVICE

BACKGROUND OF THE INVENTION

1. Field of the Invention

The present invention relates to a semiconductor device and a method of fabricating such a semiconductor device, and more particularly to a semiconductor device with a capacitive element for use in a VLSI memory circuit such as a dynamic random-access memory (DRAM) or the like and a method of fabricating such a semiconductor device.

2. Description of the Related Art

Efforts have been made to use a high-permittivity capacitive insulating film for a large capacitive value per unit area in capacitive elements of a VLSI memory circuit such as a 256-Mbit DRAM or a memory device of greater storage capability. Many research activities have been directed to a chemical vapor-phase growth process for fabricating such a high-permittivity capacitive insulating film because such a process is capable of producing a film having excellent step coverage characteristics.

FIGS. 1(a) through 1(c) of the accompanying drawings show in cross section the successive steps of a conventional process of fabricating a stacked type capacitive element in a DRAM cell which is connected to a transistor including a bit line 856 through a through hole 857 defined in an interlayer insulating film 848 that covers the transistor.

In the illustrated conventional fabrication process, a tantalum oxide ($Ta_2O_5$) film is used as a high-permittivity capacitive insulating film.

First, as shown in FIG. 1(a), a tungsten (W) film is deposited by sputtering on a lower capacitive electrode 802 composed of polysilicon. Generally, the W film is grown to a thickness of 100 nm or greater in order to be uniformly grown in a wafer.

Then, as shown in FIG. 1(b), a tantalum oxide film 811 is formed on the tungsten film by a reduced-pressure chemical vapor-phase growth process using a pentaethoxytantalum ($Ta(OC_2H_5)_5$) gas which is an organic material. Thereafter, the deposited tantalum oxide film 811 is heat-treated in an oxygen atmosphere in order to improve leak current characteristics thereof.

As shown in FIG. 1(c), an upper capacitive electrode 803 is formed on the tantalum oxide film 811. Generally, the upper capacitive electrode 803 is in the form of a tungsten film. In this manner, a capacitive element is fabricated.

The conventional capacitive structure described above suffers the following problems:

The lower capacitive electrode 802 composed of polysilicon, particularly phosphorus-doped polysilicon, has a substantially flat surface. Recently, there has been developed and put to use a technique to roughen a surface of such phosphorus-doped polysilicon by way of HSG until the surface area thereof is almost doubled.

If, however, a tungsten film is deposited to a thickness of at least 100 nm on the roughened surface of phosphorus-doped polysilicon, then the roughened surface of phosphorus-doped polysilicon will be flattened, eliminating the increase in the surface area thereof. This is because when the thickness of a tungsten film deposited on the roughened surface of phosphorus-doped polysilicon, whose grain size is controlled generally in the range of from 20 to 200 nm, reaches at least 100 nm, tungsten finds its way into particles of the roughened surface of phosphorus-doped polysilicon. Therefore, the surface of phosphorus-doped polysilicon is no longer rough, but made flat and smooth, and, as a result, does not have the increased surface area.

Another problem is that when the tungsten film is deposited by sputtering, a number of additional fabrication steps are necessary in the formation of the lower electrode region.

SUMMARY OF THE INVENTION

It is therefore an object of the present invention to provide a method of fabricating a semiconductor device having a capacitive element of excellent leak current characteristics which is produced with a surface area kept increased by a roughened surface of tungsten.

According to the present invention, there is provided a method of manufacturing a semiconductor device having a capacitive element, comprising the steps of:

removing a natural oxide film from a surface of a lower electrode of polysilicon or amorphous silicon of the capacitive element;

reacting the lower electrode from which the natural oxide film has been removed with a halogen gas of a metal of high melting point, selectively replacing the lower electrode with the metal of high melting point or a silicide of the metal of high melting point;

exposing a portion of the lower electrode which has selectively been replaced with the metal of high melting point or a silicide of the metal of high melting point, to a silane gas, and thereafter reducing the halogen gas of the metal of high melting point with a silane gas or hydrogen, thereby selectively depositing course crystal particles on the surface of the lower electrode;

forming a capacitive insulating film on the lower electrode;

densifying and nitriding the capacitive insulating film; and forming an upper electrode on the capacitive insulating film which has been densified and nitrided.

The capacitive insulating film may be a highly dielectric film made of either titanium oxide, niobium oxide, halfnium oxide, or yttrium oxide.

The natural oxide film may be removed by hydrofluoric acid anhydride or diluted hydrofluoric acid.

The capacitive insulating film may be a highly dielectric film made of tantalum oxide, the highly dielectric film made of tantalum oxide being formed of an organic material of tantalum by chemical vapor-phase growth.

The capacitive insulating film may be a highly dielectric film made of tantalum oxide, the highly dielectric film made of tantalum oxide being densified by being rapidly heated with an electric furnace or a lamp or by a plasma in an atmospheric gas of oxygen, nitrous oxide, or oxygen containing water, or a combination of these gases.

The highly dielectric film made of tantalum oxide may be densified at a temperature ranging from 200° to 600° C.

The capacitive insulating film may be a highly dielectric film made of tantalum oxide, the highly dielectric film made of tantalum oxide being densified by being heated in an atmospheric gas oxygen containing 30 to 300 ppm of water.

The metal of high melting point may be tungsten, molybdenum, or titanium.

The upper electrode may be made of titanium nitride, tungsten, molybdenum, tantalum, or a combination thereof.

The capacitive insulating film may be a highly dielectric film made of tantalum oxide, the highly dielectric film made of tantalum oxide being nitrided by a plasma in an atmosphere of ammonia, nitrogen, or nitrous oxide.

With the above arrangement, the halogen gas of the metal of high melting point and polycrystalline silicon or amorphous silicon of the lower electrode react with each other to deposit the metal of high melting point or its silicide which replace silicon molecules.

At this time, since the metal film is deposited in a manner to eat away the lower electrode due to the density difference between the deposited film and the silicon, the lower electrode has intervals made greater than when it was initially formed. The degree to which the lower electrode is eaten away can be controlled by the type of impurities in the polycrystalline silicon or amorphous silicon of the lower electrode, or the impurity concentration and the partial pressure of the halogen gas, or the reaction temperature.

Inasmuch as the amount in which the lower electrode is eaten away depends on the nuclear generation density of the deposited film, the size and density of crystal particles of the metal of high melting point or its silicide depend strongly on the conditions in which the polycrystalline silicon or amorphous silicon of the lower electrode is formed. This is because the rate of replacement is controlled by the diffusion of silicon molecules from the substrate.

When the tungsten film is exposed to an $SiH_4$ gas, the $SiH_4$ gas is dissociated and adsorbed to the surface of tungsten. When $WF_6$ is then introduced, the density of tungsten whose nuclei are generated by the reaction with $SiH_4$ is determined by the density of adsorption sites of the dissociated and adsorbed $SiH_4$ gas. It is therefore possible to easily control the nuclear generation density of tungsten formed on the polysilicon, allowing the tungsten film to have a roughened surface.

Furthermore, the capacitive insulating film is densified. The thin tungsten film, which would otherwise have a leak current problem, suffers no such problem because it is densified.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 1A:
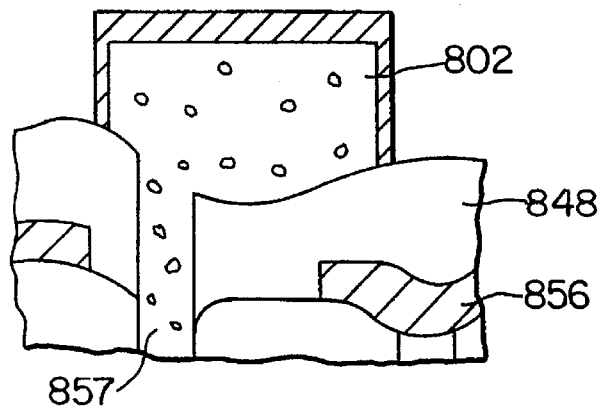
FIGS. 1(a) through 1(c) are fragmentary cross-sectional views showing the successive steps of a conventional process of fabricating a semiconductor device.
Figure 1B:
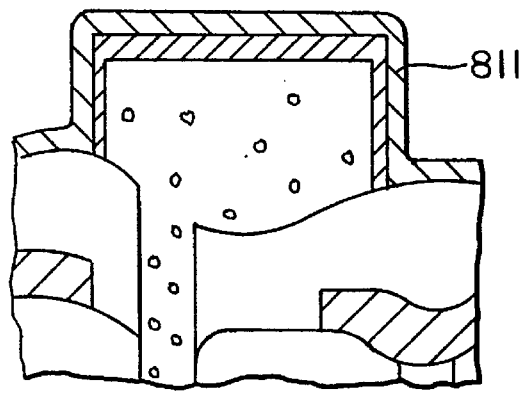
Figure 1C:
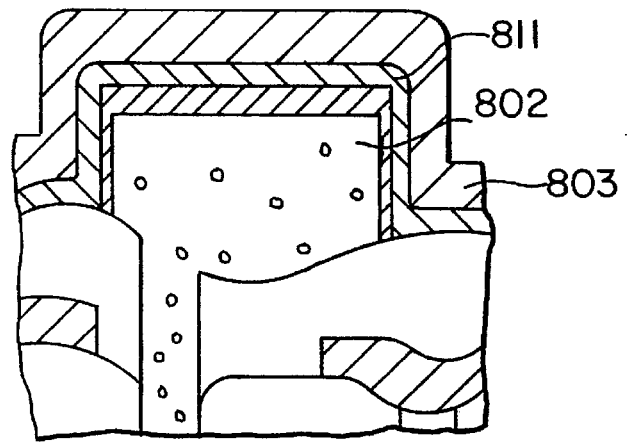
Figure 2:
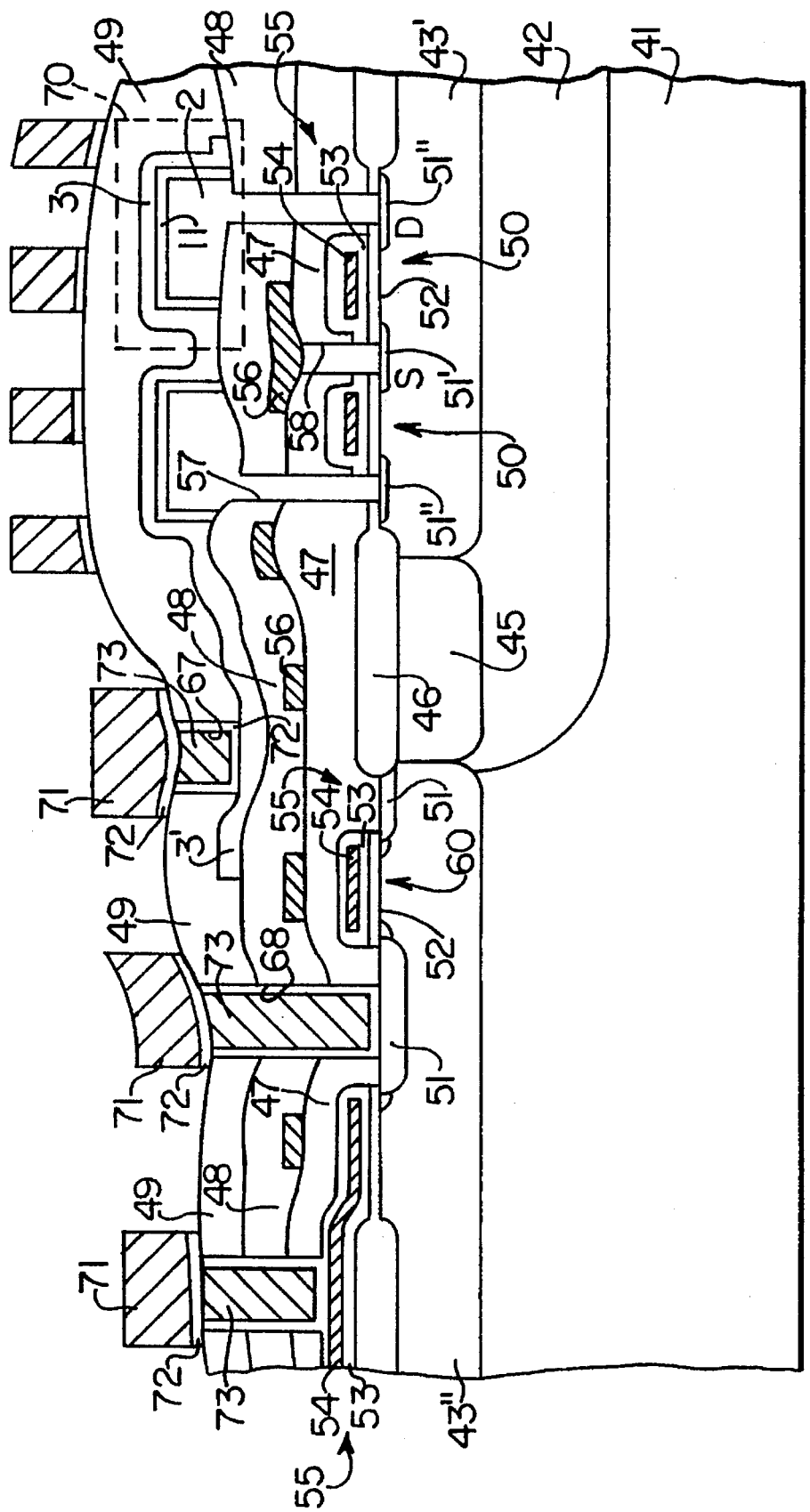
FIG. 2 is a fragmentary cross-sectional view of a partial structure of a DRAM device as a semiconductor device according to the present invention.

FIG. 2 shows in fragmentary cross section a partial structure of a DRAM device as a semiconductor device according to the present invention.

As shown in FIG. 2, an N well 42 is formed in a P-type silicon base 41. A first P well 43' is formed on the N well 42, and a second P well 43" is formed on the P-type silicon substrate 41 in spaced relation to the first P well 43' with an intervening $N^+$ separation region 45 on the N well 42. The P-type silicon substrate 41 and the wells 42, 43', 43", and the $N^+$ separation region 45 jointly make up a silicon substrate. Various elements are formed in activated regions insulated and separated by a field oxide film 46 on a principal surface of the silicon substrate.

Transistors of respective memory cells are formed on the first P well 43'. However, only a pair of such memory cells is illustrated in FIG. 2. Specifically, N-type regions 51', 51" are formed on the first P well 43', which serve as the source and drain, respectively, of transistors 50, which make up the pair of respective memory cells. Gate electrodes 55, each composed of a polysilicon layer 53 and a silicide layer 54, are formed on the first P well 43' through gate insulating films 52. The transistors 50 are covered in their entirety by a first interlayer insulating film 47.

The first interlayer insulating film 47 has a contact hole 58 through which a bit line 56 is connected to the N-type region 51' as one of the sources and drains common to the transistors of the memory cells. The bit line 56 is covered with a second interlayer insulating film 48 on which a pair of capacitive elements, one being enclosed by the dotted lines 70, is formed according to the present invention. The capacitive elements of the stacked-type are composed of respective lower capacitive electrode 2, respective tantalum oxide films 11 as capacitive dielectric films, and respective upper capacitive electrodes 3. The lower capacitive electrode 2 is connected to the N-type regions 51" as the other source and drain of the transistors through respective contact holes 57 defined in the first and second interlayer insulating films 47, 48. The upper capacitive electrodes 3 are formed continuously in common to the capacitive elements of the memory cells, and extend over the second interlayer insulating film 48 into a connecting end 3' which is electrically connected to an aluminum electrode 71 at a fixed potential such as a ground potential through a through hole 67 defined in a third interlayer insulating film 49. A titanium nitride film 72 is deposited on each of a lower surface of the aluminum electrode 71, an inner wall surface of the through hole 67, and an upper surface of the connecting end 3' of the upper capacitive electrodes 3, and the through hole 67 is filled up with a tungsten layer 73.

An N-type region 51 which serves as the source and drain of a transistor 60, as a peripheral circuit of the memory, is formed in the second P well 43". The transistor 60 has a gate insulating film 52 on which a polysilicon layer 53, a silicide layer 54, and a gate electrode 55 are formed. An aluminum interconnection 71 is connected through a titanium nitride film 72 and a tungsten layer 73 to one of the sources and drains of the N-type region 51 through a contact hole 68 which is defined in the first, second, and third interlayer insulating films 47, 48, 49. Similarly, a gate electrode structure of another transistor of the peripheral circuit is connected to the aluminum interconnection 71.

FIGS. 3(a) through 3(d) show in fragmentary cross section the successive steps of a process of fabricating the DRAM device shown in FIG. 2, particularly one of the capacitive elements, enclosed by the dotted lines 70.

Figure 3A:
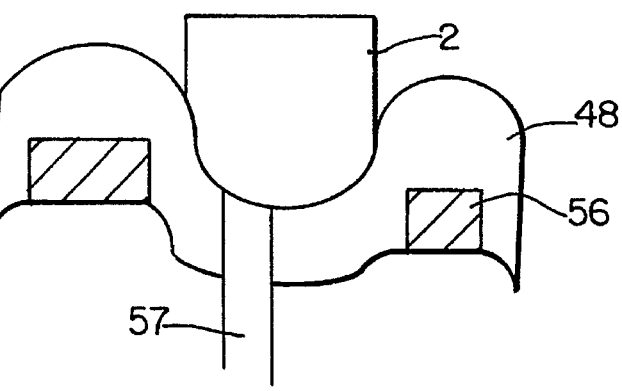
FIGS. 3(a) through 3(d) are fragmentary cross-sectional views showing the successive steps of a process of fabricating the DRAM device shown in FIG. 2.

As shown in FIG. 3(a), a phosphorus-doped amorphous polysilicon layer is deposited on a second interlayer insulating film 48 by a chemical vapor-phase growth process, and patterned into a lower capacitive electrode 2 by ordinary lithography/etching.

Figure 3B:
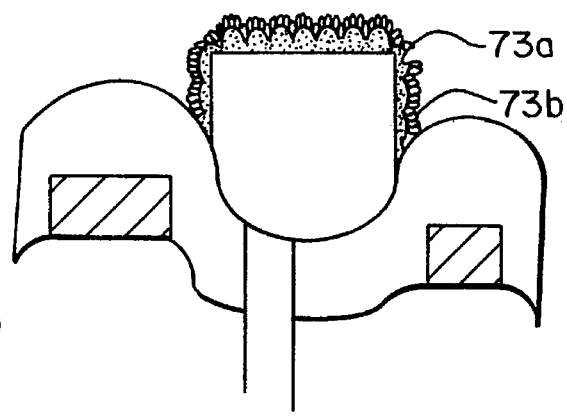

Then, the assembly is placed in a chemical vapor-phase growth apparatus that can be evacuated. While the assembly is being heated at 350° C., a $WF_6$ gas is introduced at a rate of 100 sccm and an Ar gas is introduced at a rate of 500 sccm, causing the phosphorus-doped amorphous polysilicon of the lower capacitive electrode 2 to react with $WF_6$ under a pressure of 10 mTorr according to the chemical formula:

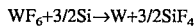

$$WF_6 + 3/2 Si \rightarrow W + 3/2 SiF_4$$

thereby replacing a surface layer of the phosphorus-doped amorphous polysilicon with a tungsten layer 73a as shown in FIG. 3(b). At this time, the nuclear generation density of tungsten varies due to the partial pressure of $WF_6$ and the concentration of impurities in the phosphorus-doped amorphous polysilicon. Specifically, since the nuclear generation density of tungsten decreases as the concentration of impurities in polycrystalline silicon is lower and the partial pressure of $WF_6$ as defined by the above formula is lower, crystalline particles of tungsten are produced in a minute coarse distribution.

After the $WF_6$ and Ar gases are discharged, the assembly is exposed to the mixture of an $SiH_4$ gas supplied at a rate of 10 sccm and an Ar gas supplied at a rate of 200 sccm. Normally, $SiH_4$ would not be easily decomposed at a low temperature. However, $SiH_4$ tends to be dissociated because of the low work function of tungsten on the surface of tungsten. Thereafter, the gases are discharged under vacuum from the apparatus, and then a $WF_6$ gas is introduced at a rate of 10 sccm, an $SiH_4$ gas is introduced at a rate of 6 sccm, and an Ar gas is introduced at a rate of 10 sccm for thereby reducing $WF_6$ with $SiH_4$, so that a tungsten layer 73b is deposited on the tungsten layer 73a as shown in FIG. 3(b). Inasmuch as the $SiH_4$ adsorbed to the surface of tungsten governs the nuclear generation density of tungsten, at this time, nuclei of tungsten begin to be generated in the form of crystalline particles smaller than the existing crystalline particles of tungsten, selectively on the surfaces of the individual crystalline particles of tungsten. Accordingly, the surface area of the lower capacitive electrode 2, which is composed of phosphorus-doped amorphous polysilicon surrounded by the tungsten layers 73a, 73b, is increased by tungsten layers 73a, 73b.

In this embodiment, a plurality of layers of tungsten are deposited on the lower capacitive electrode 2. However, if it is not necessary to increase the surface area of the lower electrode, then the tungsten growth may be stopped when a tungsten layer is deposited by the reaction of phosphorus-doped amorphous polysilicon and $WF_6$, and the produced assembly may be used as an electrode. While phosphorus-doped amorphous polysilicon is employed in the above process, polycrystalline silicon may be employed to offer the same advantages as described above.

Figure 3C:
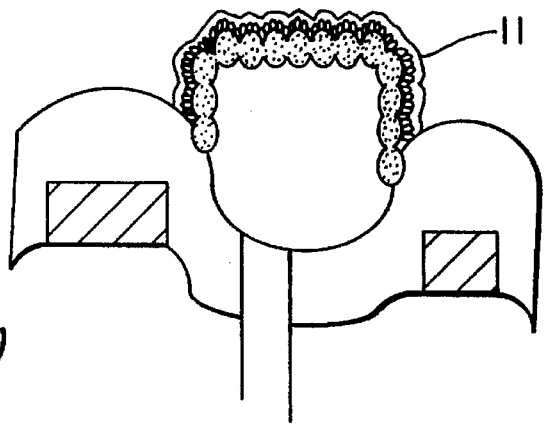

Thereafter, as shown in FIG. 3(c), a tantalum oxide film 11 is deposited on the lower capacitive electrode 2 by a chemical vapor-phase growth process.

Figure 4:
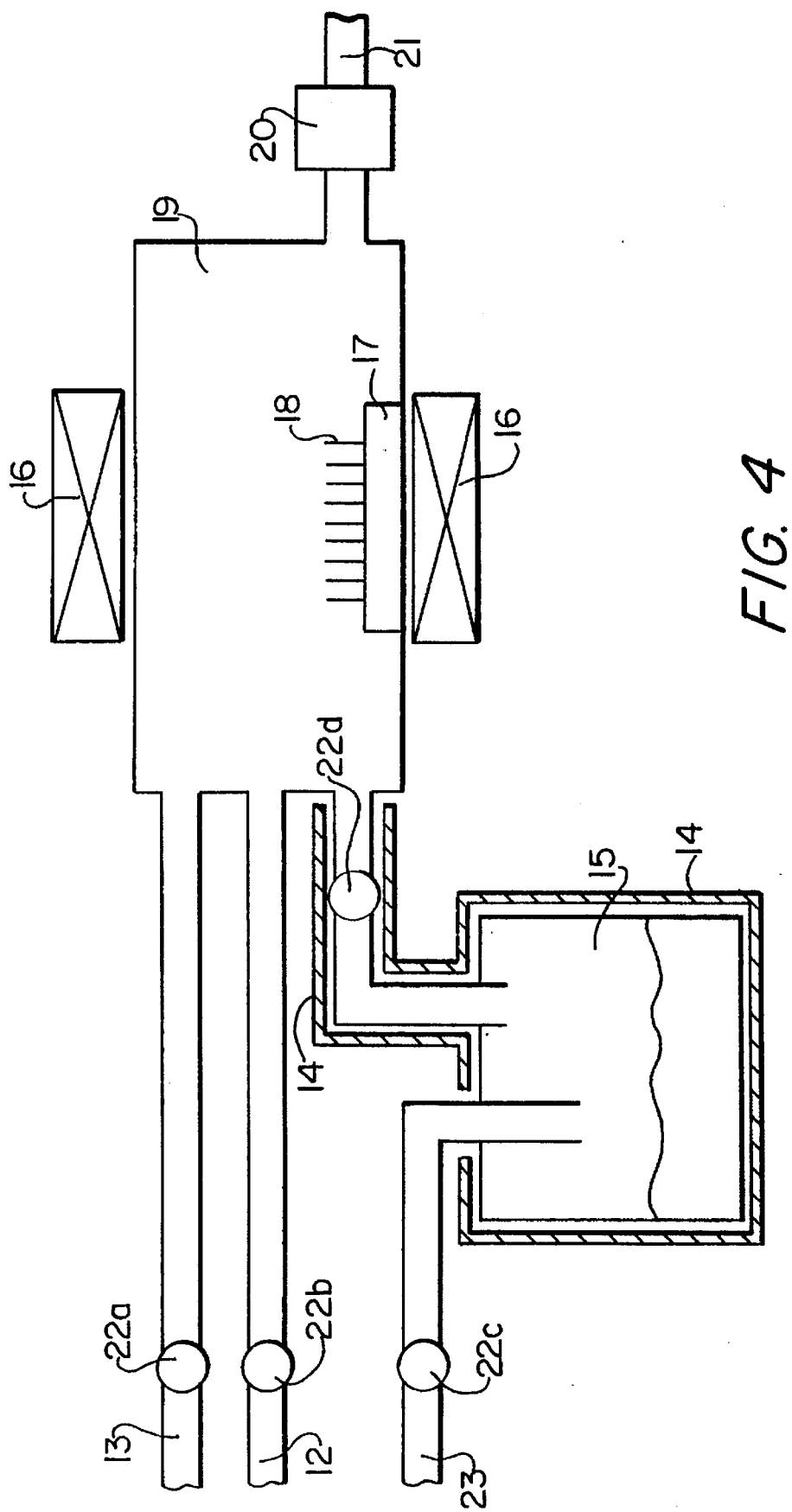
FIG. 4 is a schematic view of an apparatus for forming a tantalum oxide film in the DRAM device.

The tantalum oxide film 11 may be deposited by an apparatus shown in FIG. 4, using an organic material gas of pentaethoxytantalum. Specifically, as shown in FIG. 4, a material of pentaethoxytantalum is vaporized in a vaporization chamber 15 by a heater 14, and the produced gas of pentaethoxytantalum is introduced by a carrier gas of argon supplied from an inlet chamber 23 through a valve 22c, through a valve 22d into a reaction chamber 19 in which a substrate holder 17 with semiconductor wafers 18 supported thereon is placed. At the same time, an oxide gas is introduced from an inlet pipe 12 through a valve 22b into the reaction chamber 19. Since the interior of the reaction chamber 19 is heated by a heater 16, the organic gas of pentaethoxytantalum and the oxide gas reacts with each other, growing a tantalum oxide film on the semiconductor wafers 18. It is preferable to grow the tantalum oxide film by heating the material of pentaethoxytantalum to a temperature in the range of from 30° to 200° C. with the heater 14, heating the interior of the reaction chamber 19 to a temperature in the range of from 300° to 600° C. with the heater 16, supplying the carrier gas of argon at a rate ranging from 10 to 1000 sccm, supplying the oxide gas at a rate ranging from 0.1 to 20 slm, and keeping the interior of the reaction chamber 19 under a pressure ranging from 0.1 to 10 Torr. The reaction chamber 19 is also supplied with an argon gas from an inlet pipe 13 through a valve 22a. A vacuum pump 20 having an outlet 21 is connected to the reaction chamber 19.

In this embodiment, a tantalum oxide film is used as a capacitive insulating film. However, a highly dielectric film in the form of a titanium oxide film, a niobium oxide film, a halfnium oxide film, an yttrium oxide film, or a combination of these films may be used as a capacitive insulating film according to the present invention.

Thereafter, the tantalum oxide film is densified by a plasma using an oxide gas at a temperature ranging from 200° to 600° C. in an atmospheric gas of oxygen ($O_2$), nitrous oxide ($N_2O$), or oxygen containing 1–1000 ppm of water ($H_2O$), or a combination of these gases.

Figure 3D:
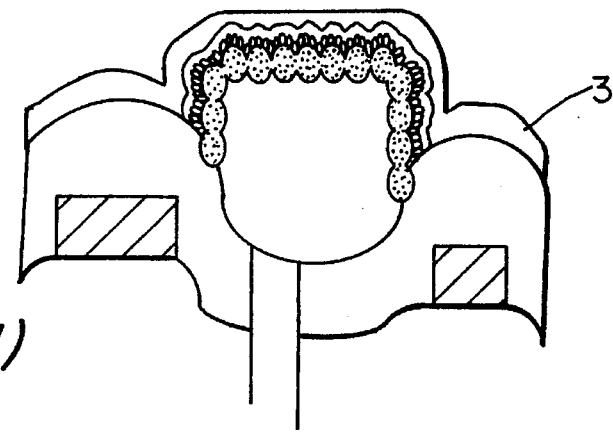

Then, as shown in FIG. 3(d), an upper capacitive electrode 3 of titanium nitride is formed. In this embodiment, the upper capacitive electrode 3 is formed as a single layer of titanium nitride. However, the upper capacitive electrode 3 may be formed as a film of a metal of high melting point such as tungsten, molybdenum, or titanium, or a film of nitride of any of these metals of high melting point, or a film of silicide of any of these metals of high melting point, or a multiple-layer film of these metals of high melting point.

Figure 5:
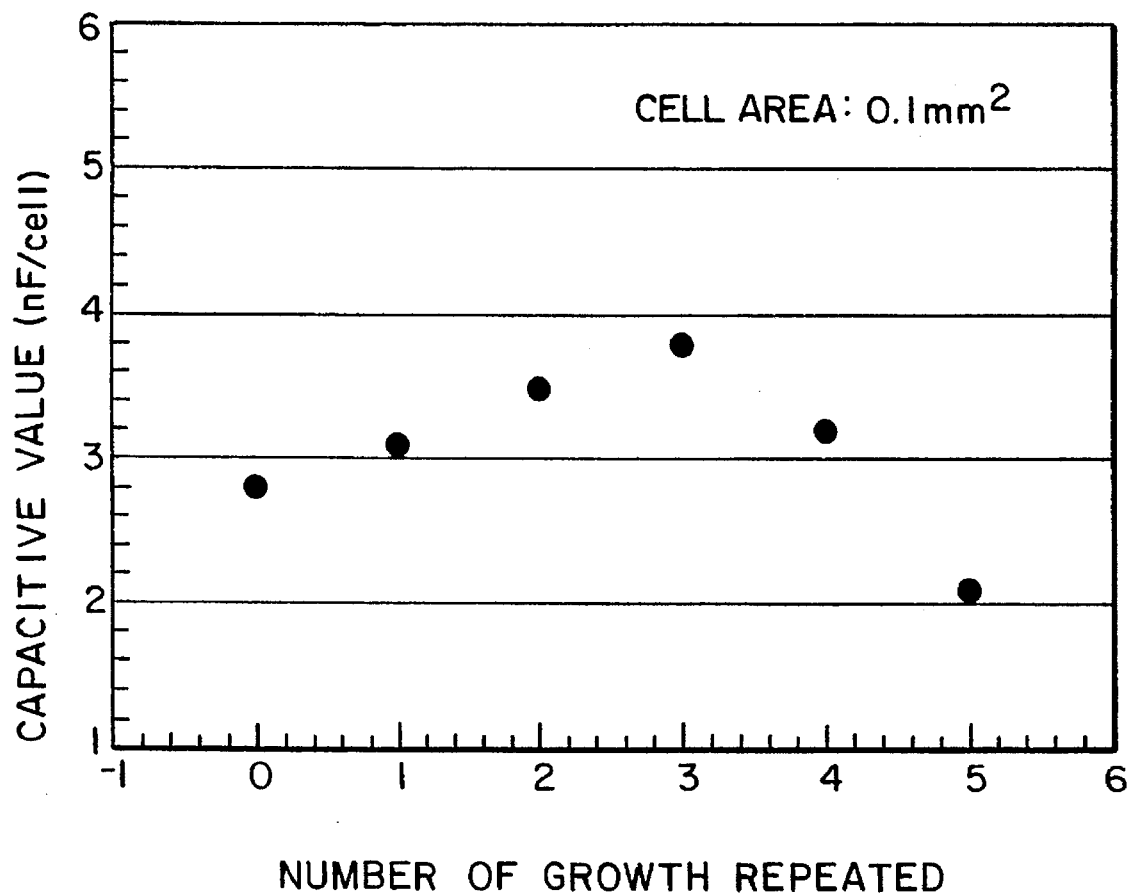
FIG. 5 is a diagram showing the capacitive value per unit area (0.1 $mm^2$) as it varies depending on the number of times that a tungsten film is formed in a capacitive element according to the present invention.

FIG. 5 shows the relationship between the capacitive value of the capacitive element fabricated as described above and the number of times that the nuclear growth of tungsten is repeated. It can be seen from FIG. 5 that the capacitive value increases as the thickness of the tungsten film increases, and then decreases, failing to achieve the advantage of a surface area increased by surface roughening, when the nuclear growth of tungsten is repeated four times or more.

Figure 6:
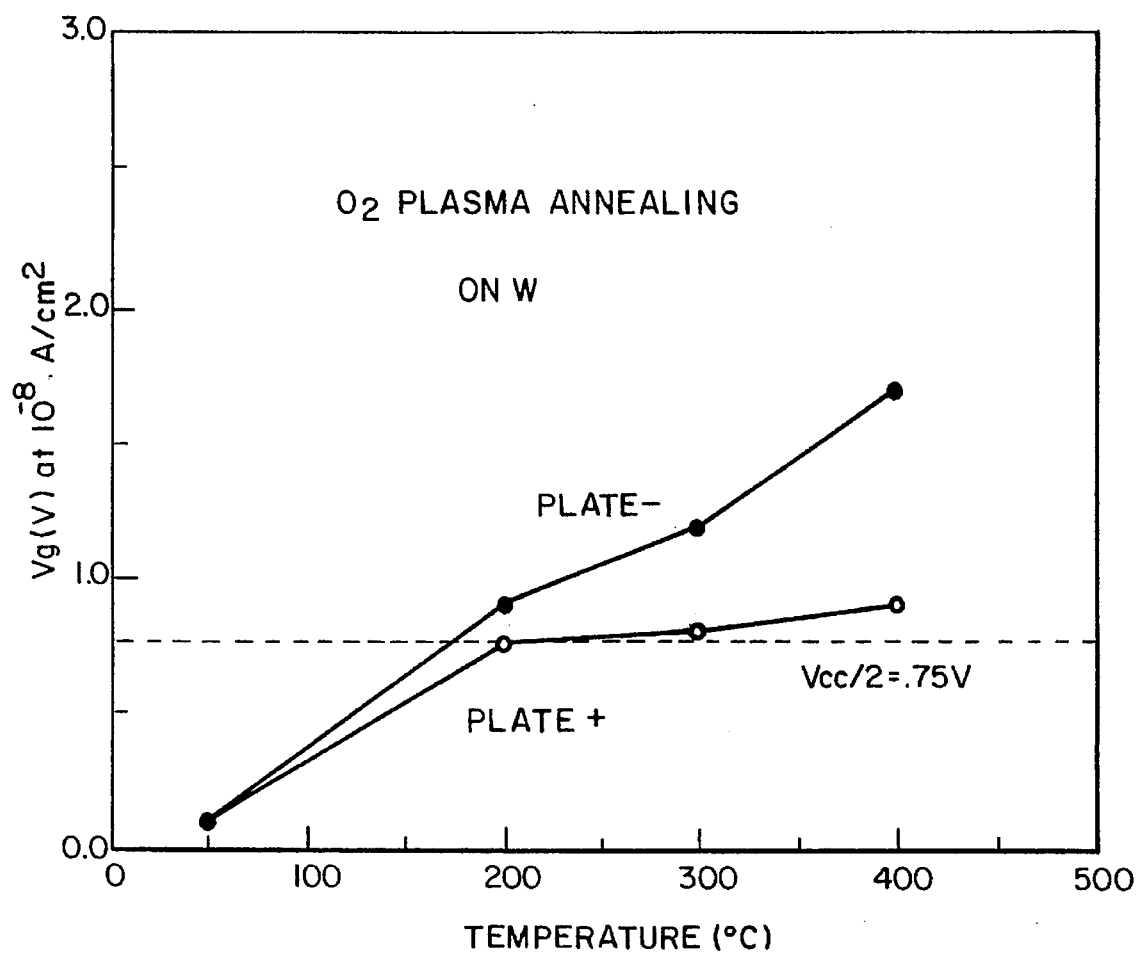
FIG. 6 is a diagram showing the voltage, at a leak current density of $10^{-8}$ $A/cm^2$, as it varies with an oxygen plasma annealing temperature in the capacitive element according to the present invention.

FIG. 6 shows the voltage, at a leak current density of $10^{-8}$ $A/cm^2$, as it varies with an oxygen plasma annealing temperature in the capacitive element which is fabricated in this embodiment. As shown in FIG. 6, both positive and negative values of the voltage increase as the oxygen plasma annealing temperature increases. This is because as the oxygen plasma annealing temperature increases, water and carbon contained in the tantalum oxide film are dispersed outwardly, and oxygen interstices in the tantalum oxide film are filled by ion bombardment in the oxygen plasma annealing, making the tantalum oxide film dense.

Figure 7:
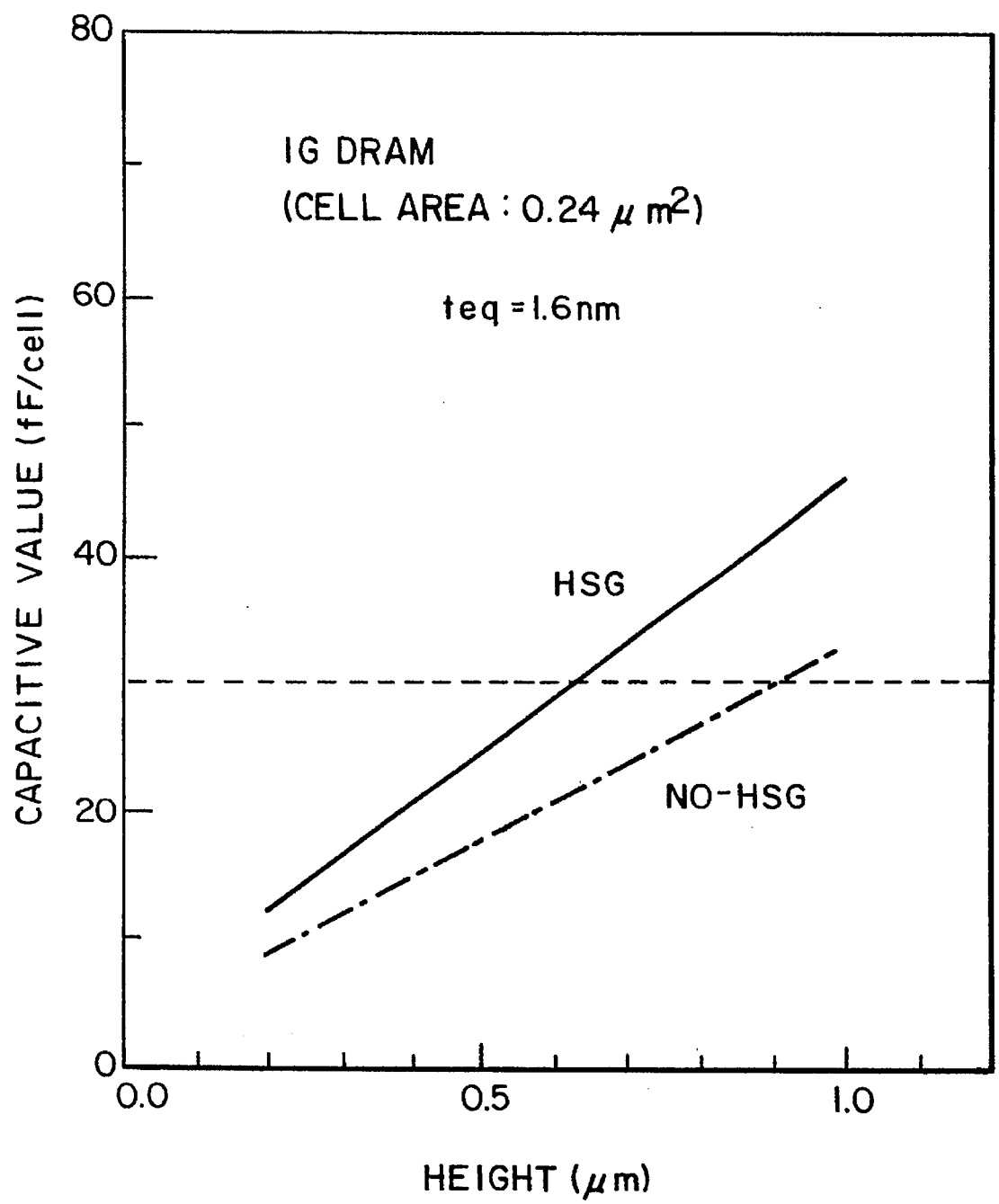
FIG. 7 is a diagram showing the capacitive value of 1-Gbit DRAM capacitive elements (cell area: 0.24 ($\mu m^2$) according to the present invention.

FIG. 7 illustrates the capacitive value of 1-Gbit DRAM capacitive elements (cell area: 0.24 ($\mu m^2$) to which the process of forming a roughened lower metal electrode on phosphorus-doped amorphous polysilicon is applied. The roughened tungsten film is formed twice, to a thickness of 50 nm. The horizontal axis of the graph shown in FIG. 7 represents the height of a stack of capacitive elements, and the vertical axis the capacitive value. The capacitive elements incorporate a capacitive insulating film having a thickness of 1.6 nm in terms of an $SiO_2$ film.

It can be understood from FIG. 7 that use of the roughened tungsten surface achieves a surface area about 1.4 times the surface area of the non-roughened surface (no-HSG), and results in a capacitive value of 30 fF with a stack height of about 0.6 μm.

Figure 8:
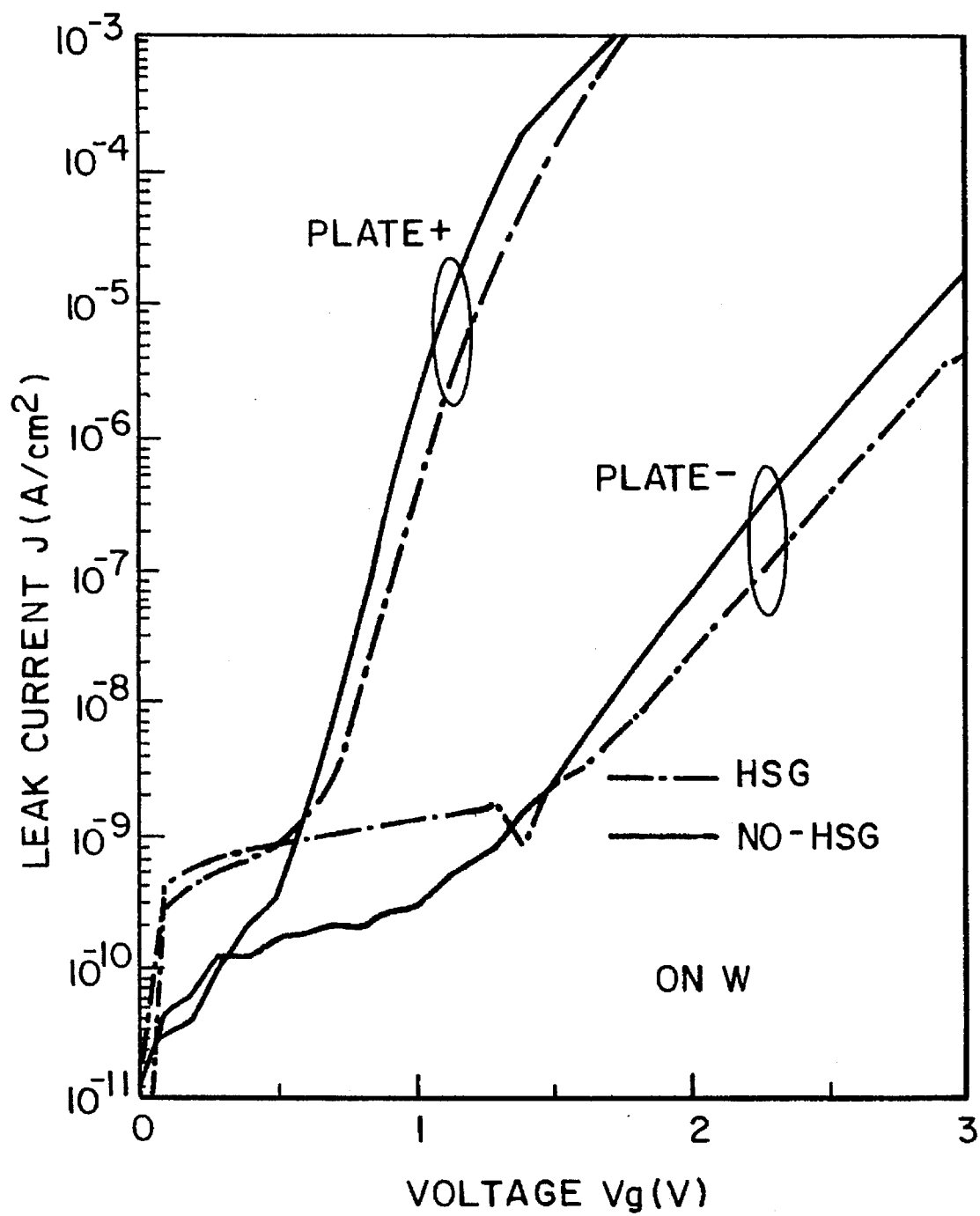
FIG. 8 is a diagram showing the leak current characteristics of a capacitive element according to the present invention.

FIG. 8 shows the leak current characteristics of the capacitive element fabricated in this embodiment. In FIG. 8, the solid-line curves represent leak current characteristics for a non-roughened surface (no-HSG) and the dot-and-dash-line curves represent leak current characteristics for a roughened tungsten surface. It can be seen from FIG. 8 that the leak current characteristics remain substantially the same regardless whether a roughened surface is used or not. A positive voltage (+) is about 0.8 V and a negative voltage (−) is about 1.7 V at a leak current density of $10^{-8}$ $A/cm^2$. These characteristics are sufficiently applicable to an internal power supply voltage (Vcc/2=0.75 V) of a 1-Gbit DRAM.

According to the present invention, as described above, a capacitive element for use in a VLSI memory circuit such as a DRAM or the like is fabricated by forming a thin, roughened tungsten film selectively on a surface of a lower electrode of polysilicon by chemical vapor-phase growth and forming a capacitive insulating film on the surface of the lower electrode of polysilicon, densifying the capacitive insulating film, and forming an upper electrode of a metal element.

It is possible according to the present invention to fabricate a capacitive element having better leak current characteristics than conventional capacitive elements while keeping a surface area increased by a roughened surface of polysilicon.

While a preferred embodiment of the present invention has been described using specific terms, such description is for illustrative purposes only, and it is to be understood that changes and variations may be made without departing from the spirit or scope of the following claims.

What is claimed is:

1. A method of manufacturing a semiconductor device having a capacitive element, comprising the steps of:

removing a natural oxide film from a surface of a lower electrode of polysilicon or amorphous silicon of the capacitive element;

reacting the lower electrode from which the natural oxide film has been removed with a halogen gas of a metal of high melting point to selectively replace the lower electrode with the metal of high melting point or a silicide of the metal of high melting point;

exposing a portion of the lower electrode which has selectively been replaced with the metal of high melting point or a silicide of the metal of high melting point to a silane gas, and thereafter;

reducing the halogen gas of the metal of high melting point with a silane gas or hydrogen to selectively deposit coarse crystal particles on the surface of the lower electrode;

forming a capacitive insulating film on the lower electrode over the coarse crystal particles deposited on the lower electrode;

densifying and nitriding the capacitive insulating film; and forming an upper electrode on the densified, nitrided capacitive insulating film.

2. A method according to claim 1, wherein the capacitive insulating film is a dielectric film made of either tantalum oxide, titanium oxide, niobium oxide, halfnium oxide, or yttrium oxide.

3. A method according to claim 1, wherein the natural oxide film is removed by hydrofluoric acid anhydride or diluted hydrofluoric acid.

4. A method according to claim 1, wherein the capacitive insulating film is a dielectric film made of tantalum oxide, and the dielectric film made of tantalum oxide is formed of an organic material of tantalum by chemical vapor-phase growth.

5. A method according to claim 1, wherein the capacitive insulating film is a dielectric film made of tantalum oxide, and the dielectric film made of tantalum oxide is densified by rapidly heating the dielectric film made of tantalum oxide with an electric furnace or a lamp or by a plasma in an atmospheric gas of oxygen, nitrous oxide, or oxygen containing water, or a combination of these gases.

6. A method according to claim 5, wherein the dielectric film made of tantalum oxide is densified at a temperature ranging from 200° to 600° C.

7. A method according to claim 1, wherein the capacitive insulating film is a dielectric film made of tantalum oxide, said dielectric film made of tantalum oxide being densified by being heated in an atmospheric gas oxygen containing 30 to 300 ppm of water.

8. A method according to claim 1, wherein the metal of high melting point comprises tungsten, molybdenum, or titanium.

9. A method according to claim 1, wherein the upper electrode is made of titanium, titanium nitride, tungsten, tungsten nitride, tangsten silicide, molybdenum, molybdenum nitride, tantalum, tantalum nitride, poly-crystalline silicon or a combination thereof.

10. A method according to claim 1, wherein the capacitive insulating film comprises a dielectric film made of tantalum oxide, and the dielectric film made of tantalum oxide is nitrided by a plasma in an atmosphere of ammonia, nitrogen, or nitrous oxide.

* * * * *